(12) United States Patent
Watanabe

(10) Patent No.: US 7,211,448 B2
(45) Date of Patent: May 1, 2007

(54) SEMICONDUCTOR DEVICE MANUFACTURING METHOD CAPABLE OF RELIABLE INSPECTION FOR HOLE OPENING AND SEMICONDUCTOR DEVICES MANUFACTURED BY METHOD

(75) Inventor: Kenichi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/428,937

(22) Filed: May 5, 2003

(65) Prior Publication Data
US 2003/0186472 A1    Oct. 2, 2003

Related U.S. Application Data

(62) Division of application No. 10/073,922, filed on Feb. 14, 2002, now Pat. No. 6,582,976.

(30) Foreign Application Priority Data
Oct. 11, 2001   (JP)   ............... 2001-313706

(51) Int. Cl.
*H01L 21/66* (2006.01)
(52) U.S. Cl. ............... 438/14; 438/15; 438/16; 438/629; 438/637
(58) Field of Classification Search ............... 438/14, 438/15, 16, 17, 18, 629, 637; 257/774
See application file for complete search history.

(56) References Cited

U.S. PATENT DOCUMENTS

| | | | | |
|---|---|---|---|---|
| 4,642,672 A | * | 2/1987 | Kitakata | ............... 257/797 |
| 4,933,743 A | | 6/1990 | Thomas et al. | ............... 357/71 |
| 5,308,929 A | * | 5/1994 | Tani et al. | ............... 174/262 |
| 5,412,210 A | * | 5/1995 | Todokoro et al. | ............... 250/310 |
| 5,444,186 A | | 8/1995 | Eguchi | ............... 174/250 |
| 5,726,482 A | | 3/1998 | Nathan et al. | ............... 257/529 |

(Continued)

FOREIGN PATENT DOCUMENTS

JP        60-109240        6/1985

(Continued)

OTHER PUBLICATIONS

Kinoshita Yasushi (JP 10-256366) (translation).*
Notice of Reasons of Rejections, May 2005, pp. 1-4.*

*Primary Examiner*—Michael Trinh
(74) *Attorney, Agent, or Firm*—Arent Fox PLLC

(57) ABSTRACT

A substrate defining an insulating surface layer portion and formed with a wiring groove filled with a wiring line the wiring line is electrically connected to a conductive member. The conductive member occupies an area larger than an area of the wiring line as viewed along a line parallel to a normal to the first surface. An insulating first film is formed on the first surface. A via hole is formed through the first film. The via hole is formed so that a boundary between the wiring line and the insulating surface layer portion passes through the inside of the via hole. The bottom of the via hole is observed with an apparatus for obtaining image information by utilizing secondary electrons and reflection electrons, to judge whether a state of the bottom of the via hole is accepted or rejected.

15 Claims, 17 Drawing Sheets

U.S. PATENT DOCUMENTS

| | | | |
|---|---|---|---|
| 5,813,881 A | 9/1998 | Nathan et al. | 439/516 |
| 5,847,466 A * | 12/1998 | Ito et al. | 257/775 |
| 5,861,675 A | 1/1999 | Sasaki et al. | 257/764 |
| 5,917,229 A | 6/1999 | Nathan et al. | 257/529 |
| 5,926,414 A | 7/1999 | McDowell et al. | 365/170 |
| 5,962,341 A | 10/1999 | Ito | 438/692 |
| 5,998,870 A | 12/1999 | Lee et al. | 257/751 |
| 6,097,094 A | 8/2000 | Ishigami | 257/763 |
| 6,127,733 A * | 10/2000 | Kinoshita | 257/773 |
| 6,215,129 B1 * | 4/2001 | Harvey et al. | 257/48 |
| 6,448,651 B1 * | 9/2002 | Kim | 257/758 |
| 6,498,384 B1 * | 12/2002 | Marathe | 257/520 |
| 6,591,491 B2 * | 7/2003 | Fujii et al. | 29/830 |

FOREIGN PATENT DOCUMENTS

| | | |
|---|---|---|
| JP | 04-012531 | 1/1992 |
| JP | 10-233374 | 9/1998 |
| JP | 10-256366 | 9/1998 |
| JP | 11-251458 | 9/1999 |
| JP | 11-297777 | 10/1999 |

* cited by examiner

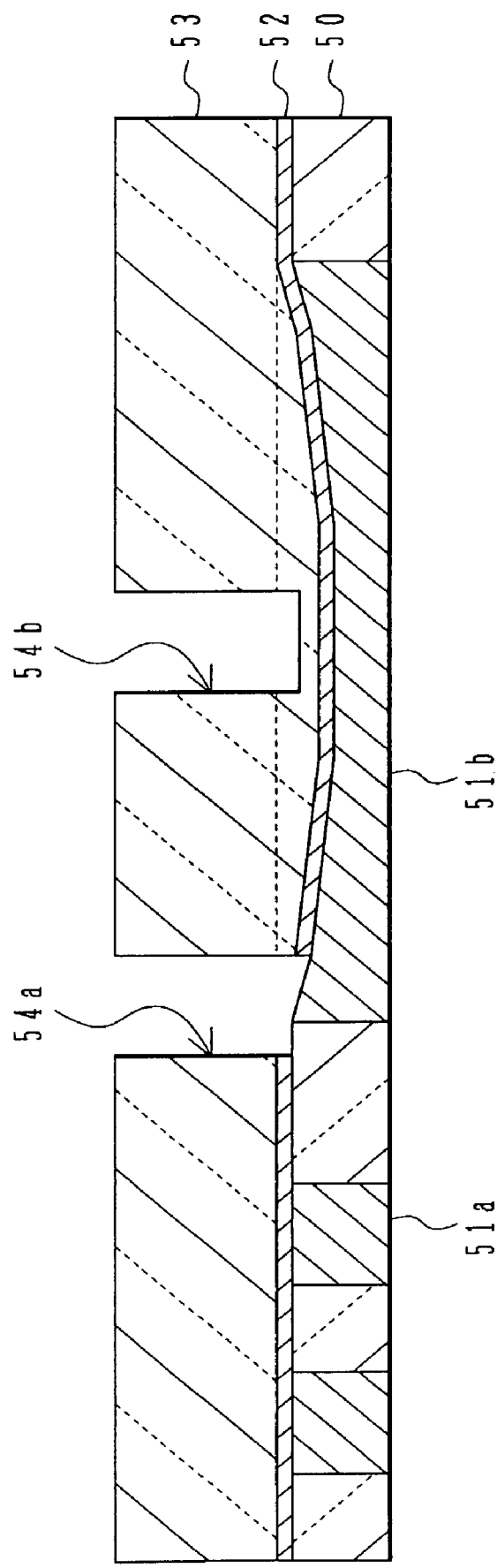

SEMICONDUCTOR DEVICE MANUFACTURING METHOD CAPABLE OF RELIABLE INSPECTION FOR HOLE OPENING AND SEMICONDUCTOR DEVICES MANUFACTURED BY METHOD

This divisional application claims the benefit of U.S. patent application Ser. No. 10/073,922, filed Feb. 14, 2002, now U.S. Pat. No. 6,582,976. The disclosure of the prior application is hereby incorporated by reference in its entirety.

CROSS REFERENCE TO RELATED APPLICATION

This application is based on Japanese patent application 2001-313706, filed on Oct. 11, 2001, the whole contents of which are incorporated herein by reference.

BACKGROUND OF THE INVENTION

A) Field of the Invention

The present invention relates to a semiconductor device manufacturing method and a semiconductor device, and more particularly to a semiconductor device manufacturing method with an inspection for hole opening for via holes to be formed through an insulating film on a wiring layer, and to semiconductor devices manufactured by such a method.

B) Description of the Related Art

Several inspection methods for hole opening are known for inspecting whether a via hole formed through an interlayer insulating film reaches the surface of the underlying layer of the interlayer insulating film.

FIG. 12A is a cross sectional view showing a peripheral area of a via hole to be inspected by the inspection method for hole opening disclosed in JP-A-60-109240. On an underlying interlayer insulating film 500, a wiring line 501 is formed. An upper interlayer insulating film 502 formed on the interlayer insulating film 500 covers the wiring line 501. A via hole 503 is formed through the interlayer insulating film 502. The via hole 503 is disposed so that the edge of the wiring line 501 passes through the bottom area of the via hole 503, as viewed along a line parallel to the normal to the substrate surface.

If the via hole 503 reaches the wiring line 501, a step formed by the wiring line 501 can be observed when the bottom of the via hole is observed with a scanning electron microscope (SEM). If the via hole 503 does not reach the wiring line 501, a step by the wiring line cannot be observed. An inspection for opening of the via hole 503 can therefore be made relying upon whether the step by the wiring line 501 can be observed.

As shown in FIG. 12B, if the edge of a wiring line 507 to be formed on an interlayer insulating film 505 having a via hole 506 is disposed in the opening of the via hole, it is possible to detect an alignment shift between the layer formed with the via hole 506 and the layer disposed with the wiring line, by observing the step on the bottom of the via hole 506.

FIGS. 13A and 13B are cross sectional views showing peripheral areas of via holes to be inspected by the inspection method for hole opening disclosed in JP-A-4-12531.

As shown in FIG. 13A, a wiring line 511 is disposed on an underlying interlayer insulating film 510. An upper interlayer insulating film 512 disposed on the interlayer insulating film 510 covers the wiring line 511. The region of the interlayer insulating film 512 above the wiring line 511 is swelled, and the interlayer insulating film 512 becomes thicker near in the central area of the wiring line 511. Therefore, as a via hole 513 is formed in an area corresponding to the wiring line 511, residues 514 are likely to be left on the wiring line 511. The left residues 514 make it difficult to detect a step of the wiring line 511.

As shown in FIG. 13B, if two wiring lines 511 are juxtaposed, the upper surface of an interlayer insulating film 512 between the two wiring lines 511 can be made generally flat. If a via hole overriding at least one of the two wiring lines is formed in the interlayer insulating film 512, residues are not left on the wiring lines 511 and a step of the wiring line or lines 511 can be detected easily.

FIG. 14 is a cross sectional view showing a peripheral area of via holes to be inspected by the inspection method for hole opening disclosed in JP-A-11-297777. On the surface of a semiconductor substrate 520, an interlayer insulating film 521 is formed on which a wiring line 522 is formed. The wiring line 522 is electrically connected to the semiconductor substrate 520 via a via hole 523 formed through the interlayer insulating film 521.

An upper interlayer insulating film 524 formed on the interlayer insulating film 521 covers the wiring line 522. Via holes 525 are formed in the interlayer insulating film 524 to expose the partial upper surfaces of the wiring line 522. The bottom of each via hole 525 observed with a SEM is bright if the wiring line 522 is exposed, and dark if the via hole 525 does not reach the wiring line 522.

Even if the wiring line 522 is exposed on the bottom of the via hole 525, the brightness of the bottom of the via hole lowers if electrons are accumulated in the wiring line 522, and this case cannot be discriminated from the case that the via hole 525 does not reach the wiring line 522. The structure that the wiring line 522 is connected to the semiconductor substrate 520 as shown in FIG. 14 can prevent accumulation of electrons in the wiring line 522.

As compared to a conventional method of forming a wiring line by patterning a metal layer through reactive ion etching (RIE), a damascene method can satisfy more easily high integration requirements of semiconductor integrated circuit devices and can expect a reduction in the number of processes. The damascene method has therefore drawn attention and is suitable for forming a copper wiring with a lowered wiring resistance.

FIG. 15A is a cross sectional view showing a peripheral area of a via hole during a process of forming a copper wiring by a damascene method. In a wiring groove formed in a surface layer of an underlying interlayer insulating film 530, a copper wiring line 532 is embedded. In order to prevent copper diffusion, the inner surface of the wiring groove is covered with a barrier metal layer 531 of tantalum (Ta) or the like.

On the interlayer insulating film 530, a silicon nitride (SiN) film 533, a silicon oxide ($SiO_2$) film 534, a low dielectric constant insulating film 535, an $SiO_2$ film 536, and an SiN film 537 are laminated in this order from the bottom. This lamination structure is formed with a via hole 538 which exposes a partial upper surface of the copper wiring line 532. A wiring groove 539 is formed overlapping the via hole 538, and reaches the bottom of the low dielectric constant insulating film 535.

FIG. 15B shows a SEM photograph showing the peripheral area of the via hole 538. Since the bottom of the via hole 538 is dark, it is not possible to judge whether the copper wiring line 532 is exposed.

FIG. 15C is a cross sectional view showing the peripheral area of a via hole 538A wherein the via hole 538A is slightly shifted from a copper wiring line 532 so that the edge of the copper wiring line 532 passes through the bottom area of the via hole 538A. The via hole 538A is formed by etching the lamination structure to the bottom of the SiO$_2$ film 534 by using the SiN film 533 as an etching stopper film and thereafter removing the SiN film 533 exposed on the bottom of the via hole.

The etching conditions for the SiN film 533 are usually set so that the interlayer insulating film 530 and copper wiring line 532 are scarcely etched. Therefore, a step corresponding to the edge of the copper wiring line 532 is not formed.

FIG. 15D is a SEM photograph showing the peripheral area of the via hole 538A. Almost the whole area of the bottom of the via hole 538A is observed dark and the boundary between the copper wiring line 532 and interlayer insulating film 503 cannot be detected. This is because there is no step as opposed to the conventional example shown in FIG. 12A.

The inspection for hole opening without utilizing a step is possible for the conventional case shown in FIG. 14. However, as a diameter of the via hole 525 becomes small, a difference between darkness and brightness of the exposed and unexposed wiring lines 522 becomes small so that highly reliable inspection for hole opening is not possible.

SUMMARY OF THE INVENTION

It is an object of the present invention to provide a semiconductor device manufacturing method capable of performing highly reliable inspection for hole opening even if a step is not formed on the bottom of a via hole and the diameter of the via hole is small.

It is another object of the present invention to provide a semiconductor device manufactured by the above-described semiconductor device manufacturing method.

According to one aspect of the present invention, there is provided a semiconductor device manufacturing method comprising steps of: (a) forming a first film of insulating material on a first surface defined on a substrate, the substrate having a surface layer portion made of insulating material and formed with a wiring groove filled with wiring line of conductive material, an upper surface of the wiring line being exposed on the first surface, the wiring line being electrically connected to a conductive member, and the conductive member occupying an area larger than an area of the wiring line as viewed along a line parallel to a normal to the first surface; (b) forming a via hole through the first film, the via hole being formed so that a boundary between the wiring line and the surface layer portion of insulating material passes through the inside of the via hole as viewed along a line parallel to the normal to the first surface; and (c) observing a bottom of the via hole with an apparatus for obtaining image information by utilizing secondary electrons and reflection electrons from a specimen, to judge whether a state of the bottom of the via hole is accepted or rejected.

According to another aspect of the present invention, there is provided a semiconductor device comprising: a substrate defining a first surface, the substrate having a surface layer portion made of insulating material and formed with a wiring groove filled with a wiring line of conductive material, an upper surface of the wiring line being exposed on the first surface, the wiring line being electrically connected to a first conductive member, and the first conductive member occupying an area larger than an area of the wiring line as viewed along a line parallel to a normal to the first surface; a first film made of insulating material and formed on the first surface of the substrate; a via hole formed in the first film, the via hole being disposed so that a boundary line between the wiring line and the surface layer portion of insulating material passes through the inside of the via hole as viewed along a line parallel to the normal to the first surface; and a second conductive member filled in the via hole and connected to the wiring line at a bottom of the via hole, wherein a bottom of said second conductive member has no step at a position corresponding to an edge of the wiring line.

Since the wiring lines are connected to a large conductive member, accumulation of charges in the wiring lines can be reduced and a clear image can be obtained by utilizing the intensity distribution of secondary electrons and reflection electrons. Since the boundary line between each wiring line and surface layer portion passes through the bottom area of the via hole, it can be judged whether the wiring line is exposed or not, by detecting a presence/absence of the boundary line on the bottom of the via hole.

BRIEF DESCRIPTION OF THE DRAWINGS

FIG. 8 is a cross sectional view of the peripheral area of a via hole for inspection for hole opening, explaining a problem of inspection for hole opening associated with the region where a wide wiring line is disposed.

DESCRIPTION OF THE PREFERRED EMBODIMENTS

Figure 1A:
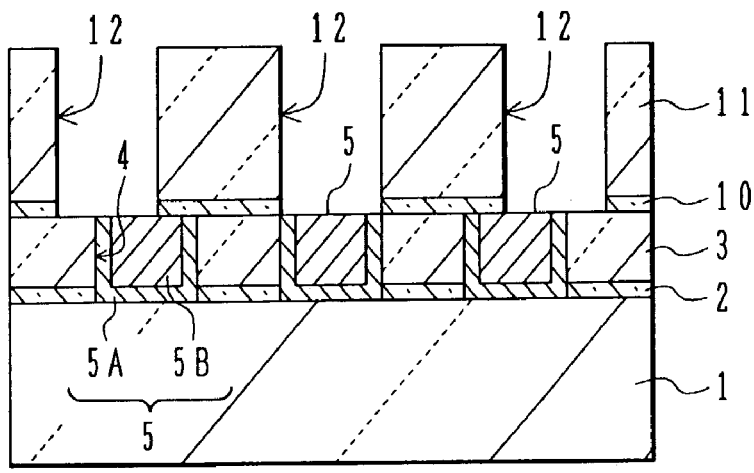
FIGS. 1A and 1B are cross sectional views of a semiconductor device according to a first embodiment.
Figure 1B:
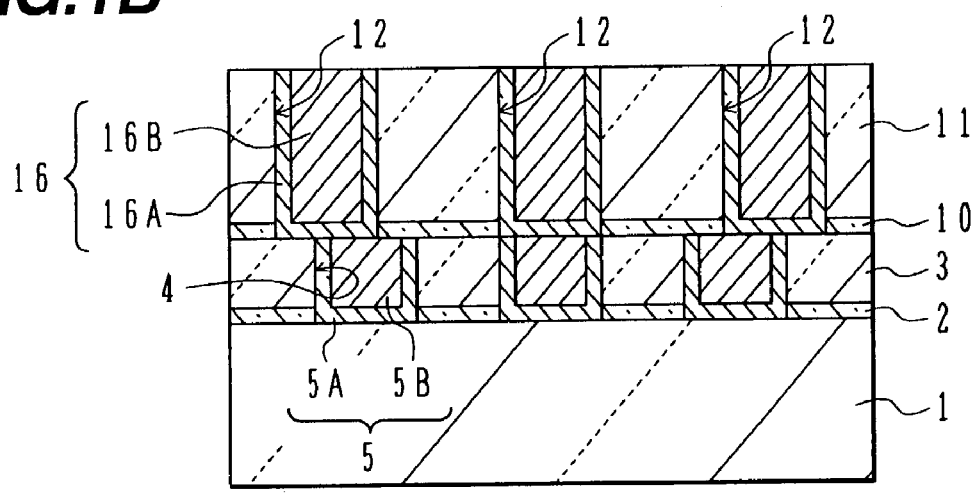
Figure 1C:
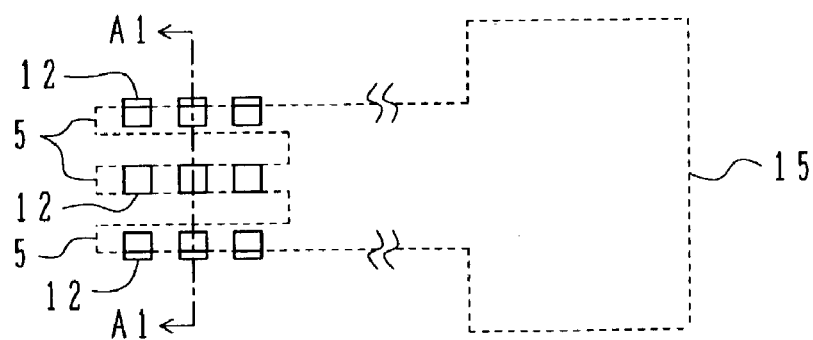
FIG. 1C is a plan view thereof.

With reference to FIGS. 1A to 1C, a semiconductor device and its manufacturing method according to the first embodiment of the invention will be described.

FIGS. 1A and 1B are cross sectional views of the peripheral area of via holes of a semiconductor device of the first embodiment. FIG. 1C is a schematic plan view of an inspection pattern for hole opening. The cross sectional views taken along one-dot chain line A1—A1 of FIG. 1C correspond to FIGS. 1A and 1B. Processes up to the state shown in FIG. 1A will be described.

On an interlayer insulating film 1 made of $SiO_2$, an etching stopper film 2 of SiN having a thickness of 50 nm is formed by plasma CVD (plasma enhanced chemical vapor deposition). On the etching stopper film 2, a wiring layer insulating film 3 of $SiO_2$ having a thickness of 500 nm is formed by plasma CVD.

On the surface of the wiring layer insulating film 3, a resist film is formed and openings corresponding to wiring grooves 4 are formed through the resist film. By using this resist film as a mask, the wiring layer insulating film 3 is dry-etched by using CF-containing etching gas, this etching being stopped at the etching stopper film 2. Wiring grooves 4 are therefore formed through the wiring layer insulating film 3. After the resist film is removed, the etching stopper film 2 exposed on the wiring grooves 4 is dry-etched by using CHF-containing etching gas.

A barrier metal layer 5A of Ta having a thickness of 30 nm is formed by sputtering, covering the inner surfaces of the wiring grooves 4 and the upper surface of the wiring layer insulating film 3. A seed layer of copper (Cu) having a thickness of 200 nm is formed on the upper surface of the barrier metal layer 5A by sputtering. Cu is plated on the seed layer to a thickness of 1500 nm. The inside of each wiring groove 4 is therefore filled with main wiring material 5B of copper. Chemical mechanical polishing (CMP) is performed until the upper surface of the wiring layer insulating film 3 is exposed. An inspection wiring pattern 5 for hole opening made of the barrier metal layer 5A and main wiring material 5B is therefore left in the wiring grooves 4.

The wiring pattern 5 is constituted, for example as shown in FIG. 1C, of three wiring lines disposed in parallel. The three wiring lines are continuous with a pad 15 formed in the same wiring layer insulating film. The pad 15 is formed at the same time when the wiring pattern 5 is formed.

On the wiring layer insulating film 3, an etching stopper film 10 of SiN having a thickness of 50 nm is formed by plasma CVD. On the etching stopper film 10, an interlayer insulating film 11 of $SiO_2$ having a thickness of 1200 nm is formed by plasma CVD. CMP is performed to planarize the surface of the interlayer insulating film 11. The thickness of the interlayer insulating film 11 after planarization is set, for example, to about 800 nm.

A resist film is formed on the interlayer insulating film 11, and openings corresponding to via holes 12 are formed through the resist film. By using this resist film as a mask, the interlayer insulating film 11 is dry-etched by using CF-containing gas, this etching being stopped at the etching stopper film 10. Via holes 12 for inspection for hole opening are therefore formed through the interlayer insulating film 11. The resist film is thereafter removed.

The etching stopper film 10 exposed on the bottoms of the via holes 12 is dry-etched by using CHF-containing gas to expose upper partial surfaces of the wiring layer insulating film 3 and wiring pattern 5 on the bottoms of the via holes 12. As shown in FIG. 1C, the via holes 12 are disposed in a matrix shape of three rows and three columns. Three rows of the via holes 12 correspond to three wiring lines 12.

In an ideal state without any alignment shift, the via holes 12 in the center row are disposed inside the center wiring line 5, and the via holes in the uppermost and lower most rows are slightly shifted from the corresponding wiring lines 5 and the edges of the corresponding wiring lines 5 pass through the bottom areas of the via holes 12. With this layout, even if there is an alignment shift between the wiring lines 5 and via holes 12, the edge of the wiring line 5 passes through the bottom areas of the via holes in the corresponding row.

The bottom of the via hole 12 was observed with an SEM and the edge of the wiring line 5 was able to be detected clearly. This may be ascribed to that since the wiring pattern 5 is connected to the pad 15 having a large area, most of electrons radiated to the wiring pattern 5 during the observation with SEM are flowed into the pad 15 and charges can be suppressed from being accumulated in the wiring pattern 5.

In order to suppress charges from being accumulated in the wiring pattern 5, it is not necessarily required that the wiring pattern be connected to the pad 15 in the same wiring layer, but the wiring pattern 5 may be connected to a large conductive region in the same wiring layer or in the lower layer. In order to sufficiently suppress charges from being accumulated in the wiring pattern 5, this conductive region has preferably an area larger than at least the wiring pattern 5. In addition to the pad, the conductive region includes a semiconductor substrate itself, an antimoisture ring disposed in the chip peripheral area, a conductive region formed at the same time when the gate electrode is formed on the semiconductor substrate. Embodiments for these cases will be later described.

After it is confirmed through the inspection for hole opening that the wiring pattern 5 is exposed on the bottoms of the via holes 12, the next process is executed. At the next process, as shown in FIG. 1B, conductive plugs 16 are filled in the via holes 12. The conductive plug 16 is made of a barrier metal layer 16A and main conductive material 16B. The conductive plug 16 is formed by a method similar to the method of forming the wiring pattern 5.

In the first embodiment, the bottom of the via hole 12 is observed with SEM. Instead, it may be observed with an apparatus for obtaining image information by utilizing an intensity distribution of secondary electrons or reflection electrons of a specimen.

Figure 2A:
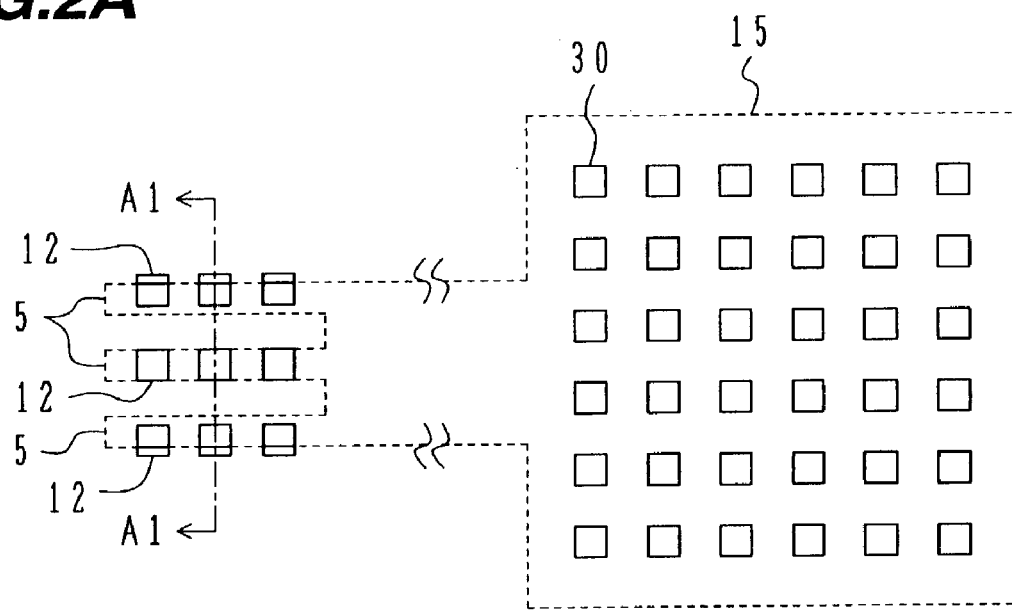
FIGS. 2A and 2B are plan views of semiconductor devices according to modifications of the first embodiment.
Figure 2B:
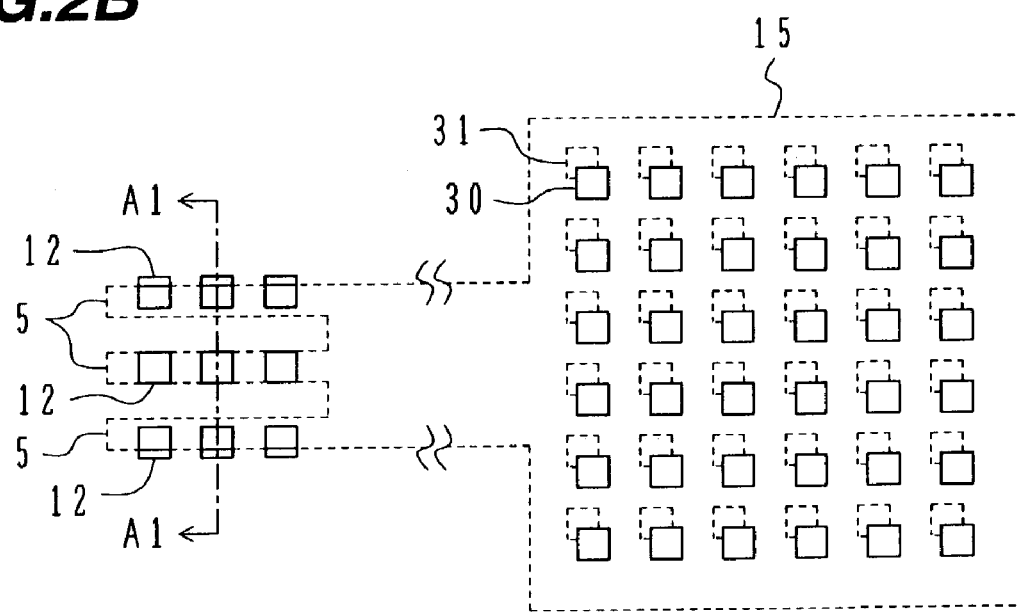

FIGS. 2A and 2B are plan views of semiconductor devices according to modifications of the first embodiment. Cross sectional views taken along one-dot chain line A1—A1 shown in FIGS. 2A and 2B are the same as the cross sectional view of the first embodiment shown in FIG. 1A.

As shown in FIG. 2A, a plurality of via holes 30 are formed inside the pad 15. Similar to the via holes 12 shown in FIG. 1A, the via holes 30 are formed through the interlayer insulating film 11 and etching stopper film 10 to expose the upper surface of the pad 15. An upper layer pad is formed on the interlayer insulating film 11. The upper layer pad is electrically connected to the lower layer pad 15 via conductive plugs embedded in the via holes 30.

In the modification shown in FIG. 2B, via holes 31 are also formed in a via layer insulating film under the pad 15. The pad 15 is electrically connected to a lower layer pad via conductive plugs embedded in the via holes 31.

If the wiring pattern 5 is connected not only to the pad 15 formed in the wiring layer but also to a lower layer pad, accumulation of charges in the wiring pattern 5 can be reduced further.

Figure 3A:
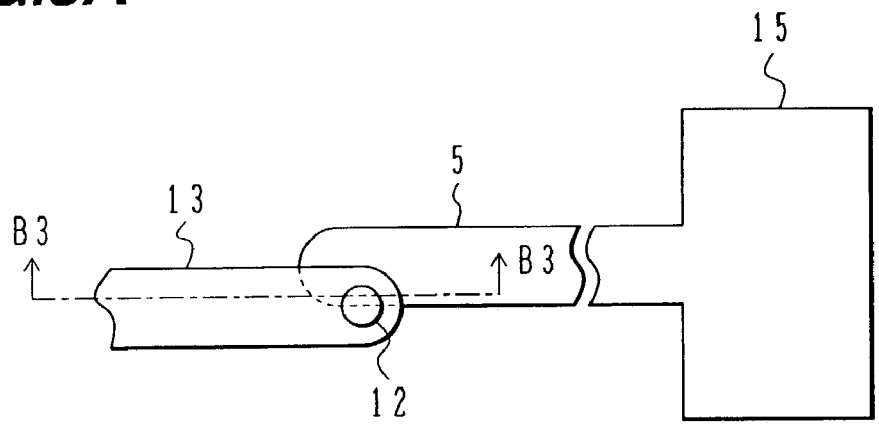
FIG. 3A is a plan view of a semiconductor device according another modification of the first embodiment.
Figure 3B:
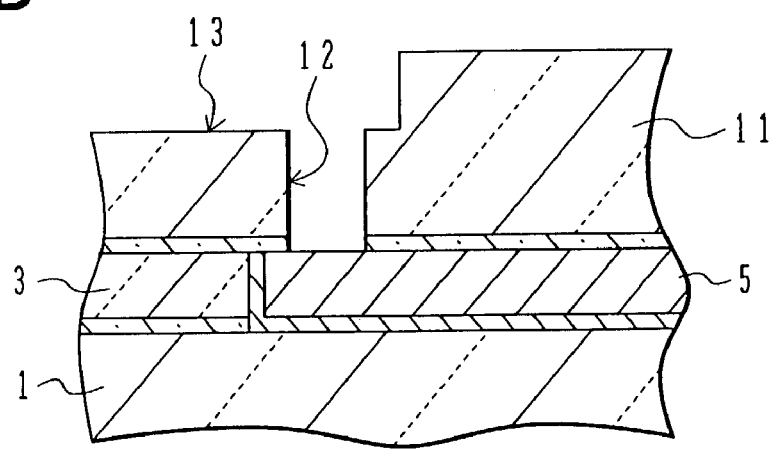
FIG. 3B is a cross sectional view thereof.
Figure 3C:
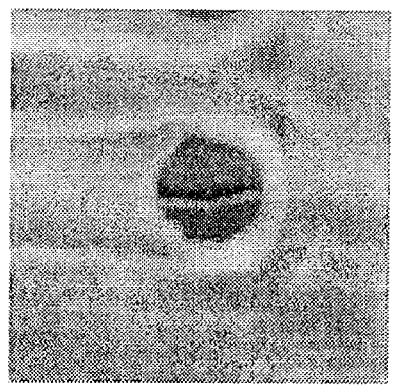
FIG. 3C is a SEM photograph thereof.

With reference to FIGS. 3A to 3C, another modification of the first embodiment will be described. FIG. 3A is a plan view showing the peripheral area of a via hole, and FIG. 3B is a cross sectional view taken along one-dot chain line B3—B3 shown in FIG. 3B. A pad 15 is connected to a wiring pattern 5. A via hole 12 is formed through an interlayer insulating film disposed on the wiring pattern 5. A wiring groove 13 inclusive of the via hole 12 as viewed in plan is formed in the interlayer insulating film 11 to the intermediate depth thereof. In the plan view shown in FIG. 3A, the edge of the wiring pattern 5 passes through the bottom area of the via hole 12.

FIG. 3C is a SEM photograph showing the bottom of the via hole 12. It can be seen that the edge of the wiring pattern 5 can be detected clearly.

Figure 4:
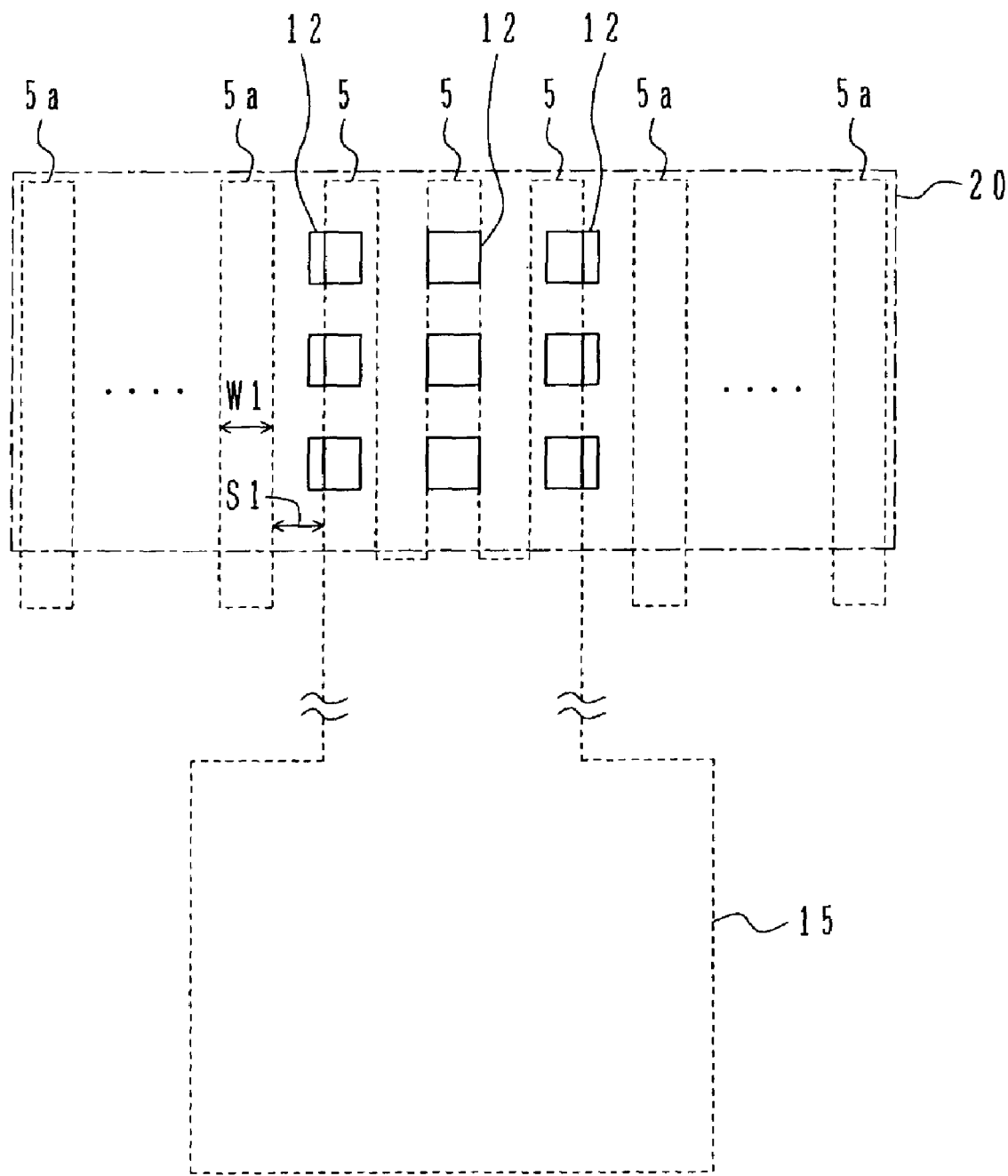
FIG. 4 is a plan view of a semiconductor device according to a second embodiment.

FIG. 4 is a plan view of an inspection pattern for hole opening of a semiconductor device according to the second embodiment. Three wiring lines 5, a pad 15, and via holes disposed in a matrix shape of three rows and three columns have the structure similar to the first embodiment shown in FIG. 1A. In the second embodiment, a plurality of dummy wiring lines 5a are disposed on both sides of and in parallel to the three wiring lines 5. The dummy wiring lines 5a are electrically isolated and are not connected to a conductive region.

The wiring lines 5 and dummy wiring lines 5a are uniformly distributed in an inspection wiring region 20. Since a plurality of wiring lines are distributed at a high density, after CMP for forming the wiring lines 5, a depression called erosion is formed on the upper surface layer of the wiring layer insulating film 3 shown in FIG. 1A in the inspection wiring region 20. Since the interlayer insulating film 11 on the wiring layer insulating film 3 is planarized, the interlayer insulating film 11 on the wiring lines 5 is thicker corresponding in amount to a depth of the depression.

In the second embodiment, even if the thickness of the interlayer insulating film 11 becomes irregular because of erosion, highly reliable inspection for hole opening is possible. In order to positively utilize erosion in the inspection wiring region 20, an area of the wiring lines in the inspection wiring region 20 is preferably set to 25% or higher of the area of the inspection wiring region 20. For example, the width W1 of each of the wring lines 5 and dummy wiring lines 5a is set to 0.2 µm and a distance between wiring lines is set to 0.6 µm.

If a depression to be formed by erosion is to be made deeper, for example, the wiring width W1 and distance S1 are both set to 1 µm, and the area of wiring lines in the inspection wiring region 20 is set to about 50% of the area of the inspection wiring region 20. The ratio of the area of wiring lines in the inspection wiring region 20 is set generally equal to the ratio of the area where opening is most difficult to be formed in a chip, i.e., the area of wirings where the deepest depression is formed by erosion. With this setting, it is possible to judge the state of openings in the whole area of the chip through the inspection for hole opening in the inspection wiring region 20.

Figure 5A:
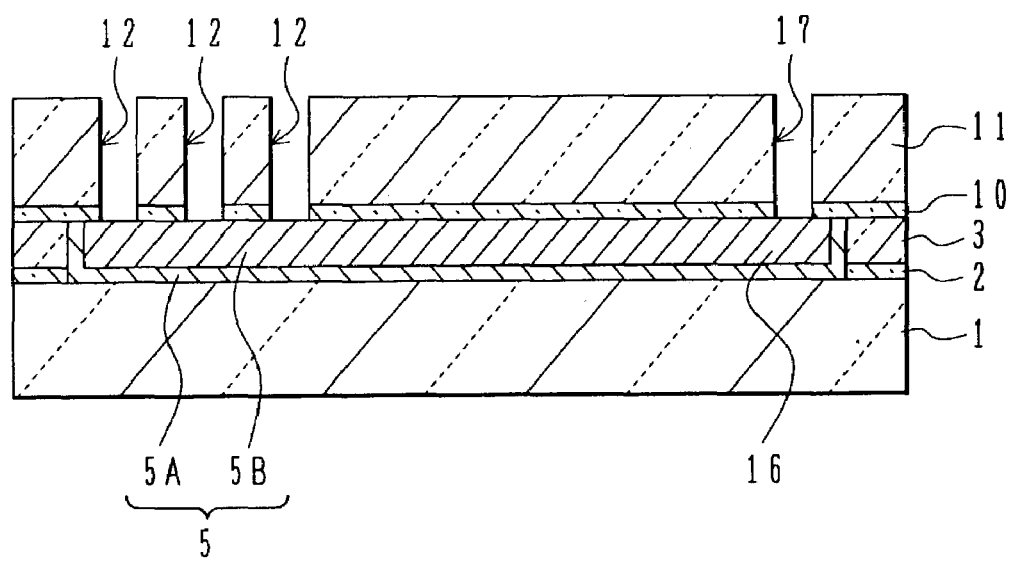
FIG. 5A is a cross sectional view of a semiconductor device according to a third embodiment.
Figure 5B:
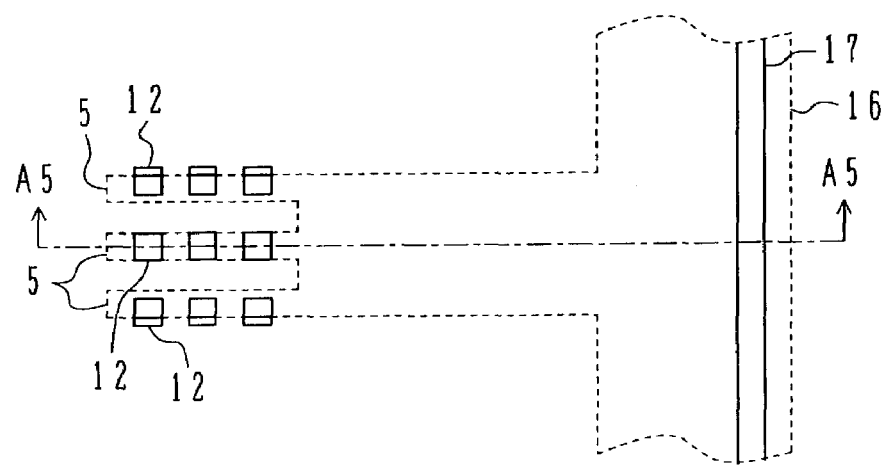
FIG. 5B is a plan view thereof.

FIGS. 5A and 5B are a cross sectional view and a plan view showing a semiconductor device according to the third embodiment. FIG. 5A corresponds to the cross sectional view taken along one-dot chain line A5—A5 shown in FIG. 5B.

In the first embodiment, the wiring pattern 5 is connected to the pad 15 as shown in FIG. 1C. In the third embodiment, a wiring pattern 5 is connected to an antimoisture ring 16. The antimoisture ring 16 is formed by the same process as that of forming the wiring pattern 5, and extends one turn along the outer peripheral area of the chip. The layout of the wiring pattern 5 and via holes 12 is similar to that of the semiconductor device of the first embodiment shown in FIGS. 1A and 1B.

An antimoisture ring groove 17 is formed through an interlayer insulating film 11 and an etching stopper film 10. The antimoisture ring groove 17 is formed by the same process as that of forming the via holes 12, and disposed on the underlying antimoisture ring 16.

In the third embodiment, the antimoisture ring 16 suppresses accumulation of charges in the wiring pattern 5, similar to the pad 15 of the first embodiment. It is therefore easy to perform inspection for hole opening.

Figure 6A:
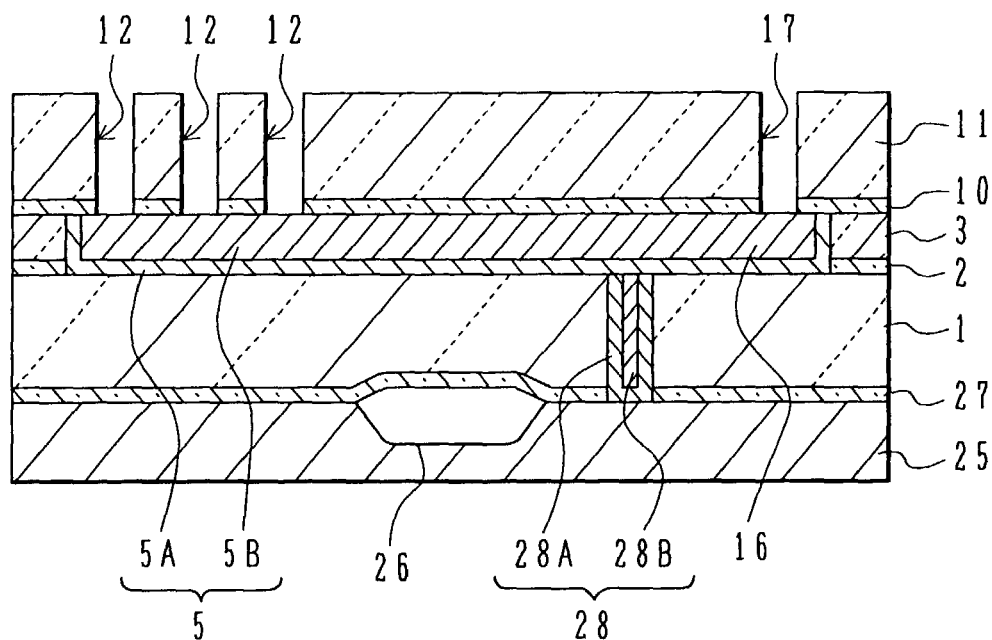
FIG. 6A is a cross sectional view of a semiconductor device according to a fourth embodiment.
Figure 6B:
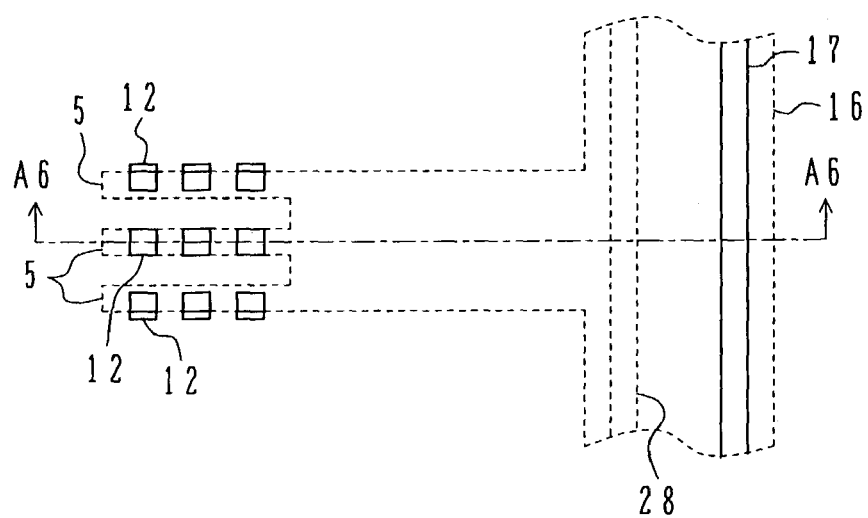
FIG. 6B is a plan view thereof.

FIGS. 6A and 6B are a cross sectional view and a plan view showing a semiconductor device according to the fourth embodiment. FIG. 6A corresponds to the cross sectional view taken along one-dot chain line A6—A6 shown in FIG. 6B.

As shown in FIG. 6A, on the surface of a silicon semiconductor substrate 25, an element separation insulating region 26 is formed by local oxidation of silicon (LOCOS) or shallow trench isolation (STI). An etching stopper film 27 of SiN covers the surface of the substrate 25. An interlayer insulating film 1 of SiO$_2$ is formed on the etching stopper film 27. The layers above the interlayer insulating film 1 have the same structure as that of the semiconductor device of the third embodiment shown in FIG. 5A.

An antimoisture ring 28 is embedded in a groove formed through the interlayer insulating film 1 and etching stopper film 27. The antimoisture ring 28 is constituted of a barrier metal layer 28A of TiN covering the inner surface of the groove and a main conductive member 28B of tungsten filling the inside of the groove. The antimoisture ring 28 electrically connects the wiring pattern 5 to the substrate 25. Since the wiring pattern 5 is connected to the substrate 25, it is possible to prevent accumulation of charges in the wiring pattern 5. Instead of connecting the wiring pattern 5 to the substrate via the antimoisture ring 28, it may be connected to the substrate via a usual conductive plug.

Figure 7:
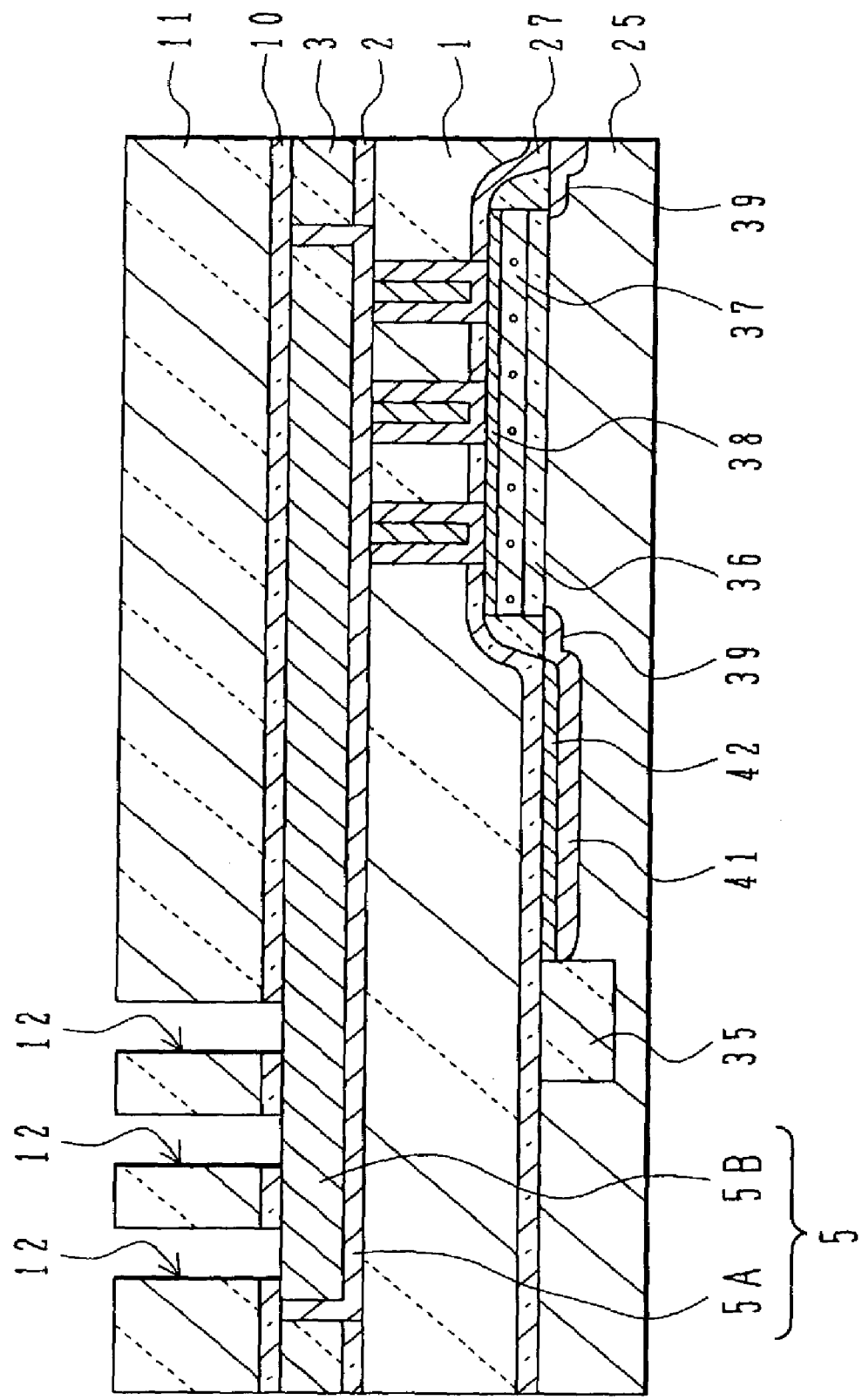
FIG. 7 is a cross sectional view of a semiconductor device according to a fifth embodiment.

FIG. 7 is a cross sectional view showing a semiconductor device according to the fifth embodiment. On the surface of a semiconductor substrate 25, an element separation insulating region 35 is formed to define active regions. The active region is formed in a p-type or n-type well.

A lamination structure is formed on an upper partial surface of the active region, the lamination structure having three layers including an SiO$_2$ film 36, a polysilicon film 37 and a silicide film 38 of TiSi or CoSi. On the side walls of the lamination structure, side wall spacers 29 of SiO$_2$ are formed. The SiO$_2$ film 36 and polysilicon film 37 are formed at the same time when the gate insulating film and gate electrode of a MOSFET disposed in another area of the semiconductor substrate are formed. The silicide film 38 is formed by a well-known salicide (self aligned silicide) process.

In the surface layer of the semiconductor substrate 25 on both sides of the lamination structure, impurity doped regions 41 are formed. The impurity doped region 41 can be formed by the same process as that of implanting ions for the source and drain regions of MOSFET. The upper surface of the impurity doped region 41 is covered with a silicide film 42 of TiSi or CoSi. The silicide film 42 is formed at the same time when the silicide film 38 is formed.

An etching stopper film 27 of SiN is formed on the semiconductor substrate 25, covering the lamination structure. On this etching stopper film 27, an interlayer insulating film 1 of SiO$_2$ is formed. The structure above the interlayer insulating film 1 is similar to that of the semiconductor device of the third embodiment shown in FIG. 5A.

Via holes exposing partial surface areas of the silicide film 38 are formed through the interlayer insulating film 1, and conductive plugs 40 are embedded in the via holes. The conductive plug 40 is constituted of a barrier metal layer 40A of TiN covering the inner surface of the via hole and a main conductive member 40B of tungsten filling the inside of the via hole. The conductive plugs 40 connect the wiring pattern 5 to the silicide film 38. The wiring pattern 5 is therefore electrically connected to the polysilicon film 37. The polysilicon film 37 and semiconductor substrate 25 sandwich the SiO$_2$ film 36, constituting a capacitor.

In the fourth embodiment shown in FIG. 6A, the wiring pattern 5 is electrically connected directly to the semiconductor substrate 25. In the fifth embodiment, the wiring pattern 5 is connected to the semiconductor substrate 25 via the capacitor constituted of the polysilicon film 37 and semiconductor substrate 25.

When the bottoms of via holes 12 are observed with SEM, most of electrons incident upon the wiring pattern are accumulated in the capacitor constituted of the polysilicon film 37 and semiconductor substrate 25. It is therefore possible to reduce the amount of charges to be accumulated in the wiring pattern 5.

In the first to fifth embodiments described above, the wiring line and via hole are disposed so that the edge of the wiring line passes through the bottom area of the via hole as viewed along a line parallel to the normal to the substrate. If a wiring line is wide, it is difficult to perform highly reliable inspection for hole opening in the manner described above. This difficulty will be explained in the following.

As shown in FIG. 8, in a wiring layer insulating film 50, fine wiring lines 51a and a wide wiring line 51b are embedded. CMP for forming wiring lines forms a depression in the upper surface layer of the wide wiring line 51b. An etching stopper film 52 and a via layer insulating film 53 are formed in this order on the wiring lines 51a and 51b and wiring layer insulating film 50.

The surface of the via layer insulating film 53 is planarized by CMP. Therefore, the via insulating film 53 is thicker above the central area of the wide wiring line 51b. Even if it is confirmed, by inspection for hole opening through a via hole 54a disposed overlapping the edge of the wide wiring line 51b, that the wiring line 51b is exposed, it is not possible to guarantee that a via hole 54b disposed in the central area of the wiring line 51b reaches the upper surface of the wiring line 51b. A chip may have the structure that a via hole is disposed in the central area of the wide wiring line. High reliability is not guaranteed for an inspection for hole opening using only the via hole 54a overlapping the edge of the wide wiring line 51b. In the sixth embodiment to be described in the following, highly reliable inspection for hole opening is possible even if a via hole is disposed in the central area of a wide wiring line.

Figure 9A:
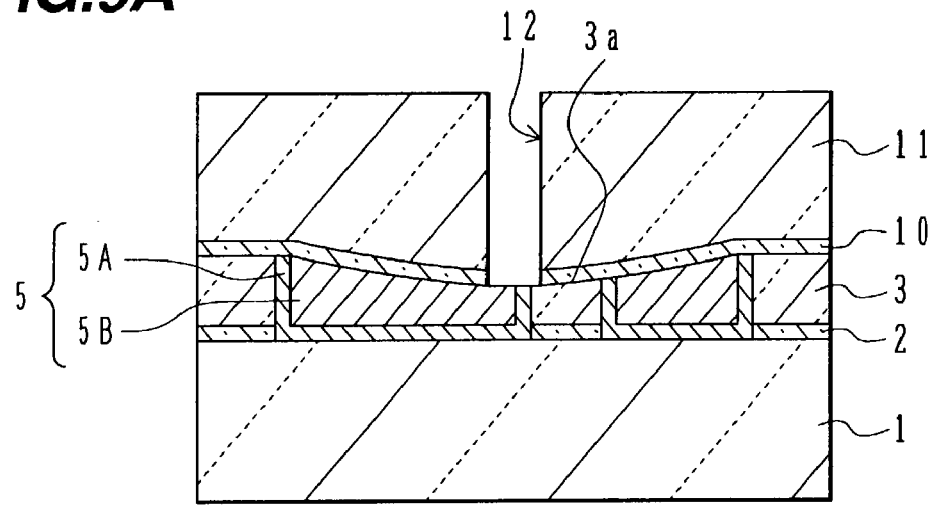
FIG. 9A is a cross sectional view of a semiconductor device according to a sixth embodiment.
Figure 9B:
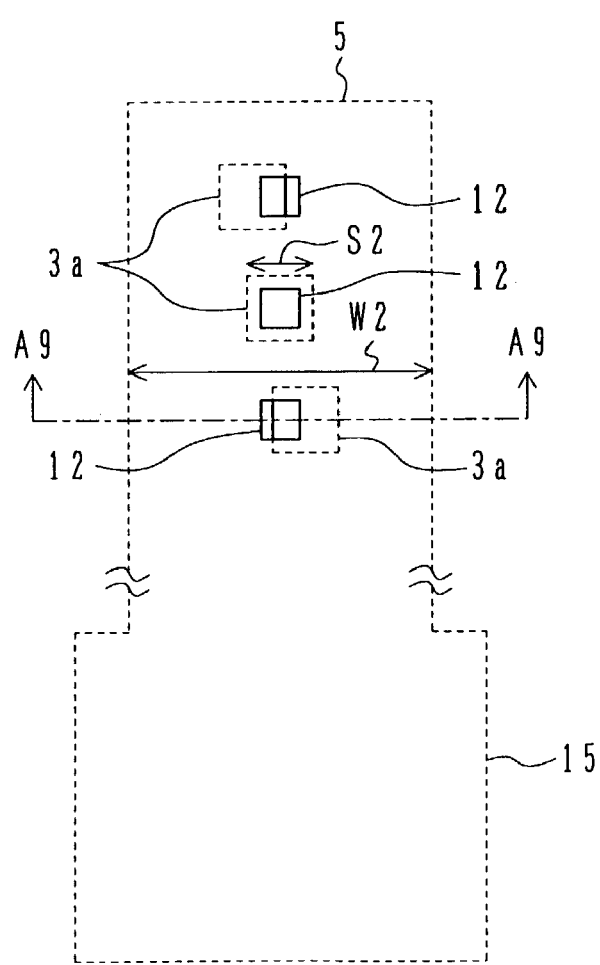
FIG. 9B is a plan view thereof.

FIG. 9A is a cross sectional view of a semiconductor device according to the sixth embodiment, and FIG. 9B is a plan view thereof. FIG. 9A corresponds to the cross sectional view taken along one-dot chain line A9—A9 shown in FIG. 9B. The cross sectional structure shown in FIG. 9A is almost similar to that of the semiconductor device of the first embodiment shown in FIG. 1A. In the first embodiment, the wiring line has such a width as a depression is not formed on the upper surface thereof. In the sixth embodiment, since a wiring pattern 5 is wide, a depression is formed on the upper surface thereof.

Insulating regions 3a formed by partially leaving a wiring layer insulting film 3 are disposed in the wide wiring pattern 5. The wiring pattern 5 surrounds the insulating region 3a. In the example shown in FIG. 9B, three insulating regions 3a are disposed along a longitudinal direction of the wiring pattern 5. The insulating regions 3a are shifted from each other along a width direction of the wiring pattern 5. It is preferable to form the insulating regions 3a in an area where the depression is deepest.

A via hole 12 is disposed in correspondence to each of the insulating regions 3a. The three via holes 12 are disposed at the same position along the width direction of the wiring pattern 5. As viewed along a line parallel to the normal to the substrate surface, at least one of the via holes 3a overlaps the edge of the corresponding insulating region 3a. The wide wiring pattern 5 is connected to a pad 15, similar to the first embodiment shown in FIGS. 1A to 1C.

Since the via hole reaches the wiring pattern 5, a boundary line between the wiring pattern 5 and insulating region 3a appears on the bottom of the via hole 12. Inspection for hole opening is possible by observing the boundary line with SEM. The via hole 12 for inspection for hole opening passes through the thick region of the interlayer insulating film 11 on the wiring pattern 5. Highly reliable inspection for hole opening is therefore possible.

The positional relations between the insulating regions 3a and via holes 12 of three pairs are different along the width direction of the wiring pattern 5. Therefore, even if there is some alignment error, inspection for hole opening is possible by using one of the three pairs.

Next, with reference to FIGS. 10A to 10H, a method of manufacturing a semiconductor device having an inspection pattern for hole opening of one of the embodiments will be described.

Figure 10A:
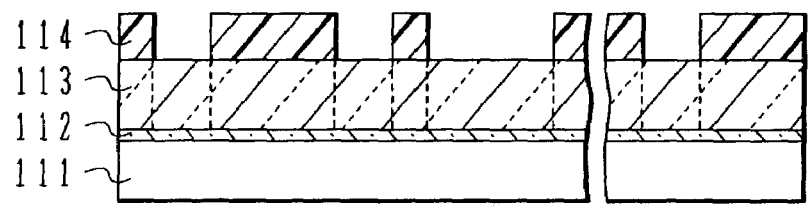
FIGS. 10A to 10H are cross sectional views illustrating a semiconductor device manufacturing method applicable to an inspection for hole opening used by the semiconductor devices of the embodiments.

As shown in FIG. 10A, an etching stopper film 112 is formed on an underlying layer 111, and a wiring layer insulating film 113 is formed on the etching stopper film 112. For example, after MOSFET's are formed in active regions of a semiconductor wafer, an insulating film is formed on the wafer, and the underlying layer 111 has the structure that conductive plugs are embedded in the insulating film or the structure that conductive plugs are embedded in an upper via layer insulating film above the insulating film.

For example, the etching stopper film 112 is made of SiN having a thickness of 50 nm. The SiN film has an etching stopper function and a Cu diffusion prevention function. The wiring layer insulating film 113 is made of, for example, SiO$_2$ having a thickness of 500 nm. On the surface of the wiring layer insulating film 113, a resist film 114 is formed having an opening corresponding to a wiring pattern.

By using the resist film 114 as an etching mask, the wiring layer insulating film 113 is etched by reactive ion etching (RIE) using CF-containing etching gas. This etching is stopped at the etching stopper film 112. Thereafter, the resist film 114 is removed by ashing using oxygen plasma. During this ashing, the underlying layer 111 is covered with the etching stopper film 112 so that the surface of conductive members in the underlying layer 111 can be prevented from being oxidized. The etching stopper film 112 exposed on the bottoms of grooves formed through the wiring layer insulating film 113 is removed by RIE using CHF-based etching gas. With the above processes, wiring grooves are formed.

Via holes for inspection for hole opening of one of the first to sixth embodiments are formed through the wiring layer insulating film 113 and etching stopper film 112, to perform inspection for hole opening.

Figure 10B:
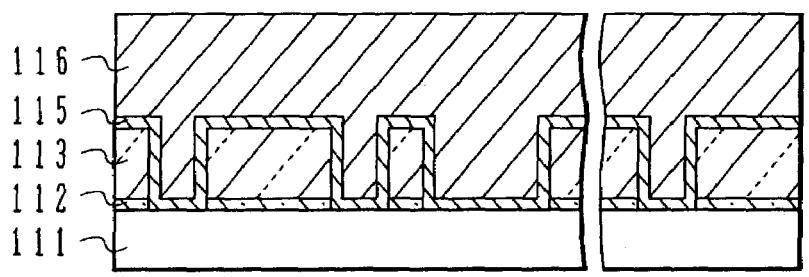

As shown in FIG. 10B, a barrier metal layer 115 and a main wiring layer 116 are formed on the structure with the wiring grooves. For example, the barrier metal layer 115 is made of Ta having a thickness of 30 nm, by sputtering, and the main wiring layer 116 is made of Cu by sputtering or plating. If the main wiring layer 116 is formed by plating, a Cu seed layer is first formed by sputtering and then Cu is plated on the Cu seed layer.

After the barrier metal layer 115 and main wiring layer 116 are formed, CMP is performed to remove the main wiring layer 116 and barrier metal layer 115 above the upper surface of the wiring layer insulating film 113.

Figure 10C:
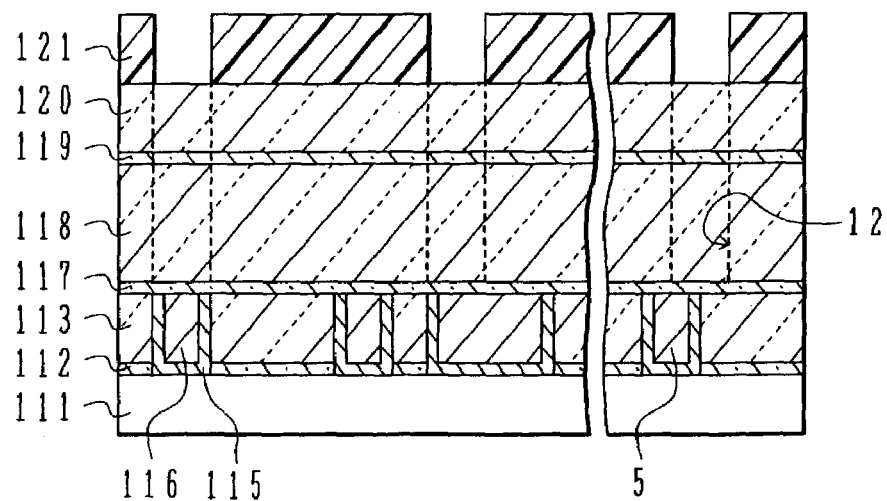

As shown in FIG. 10C, the wiring lines made of the barrier metal layer 115 and main wiring layer 116 are therefore left in the wiring grooves formed through the wiring layer insulating film 113. At this time, a wiring pattern 5 for inspection for hole opening is also formed. The inspection wiring pattern 5 for hole opening may be disposed in the chip or on the scribe line. On the wiring layer insulating film 113, an etching stopper film 117 of the second layer is formed. For example, the etching stopper film 117 is made of SiN having a thickness of 50 nm. On the etching stopper film 117, a via layer insulating film 118 is formed. For example, the via layer insulating film 118 is made of $SiO_2$ having a thickness of 1200 nm.

After the via layer insulating film 118 is formed, CMP is performed to planarize the upper surface of the via layer insulating film 118. After planarization of the via layer insulating film 118, an etching stopper layer 119 of the third layer and a wiring layer insulating film 120 are formed. For example, the etching stopper film 119 is made of SiN having a thickness of 50 nm, and the wiring layer insulating film 120 is made of $SiO_2$ having a thickness of 500 nm. A resist film 121 having via hole openings is formed on the wiring layer insulating film 120.

By using the resist film 121 as an etching mask, the wiring layer insulating film 120, etching stopper film 119 and via layer insulating film 118 are etched by using CF-containing etching gas, CHF-containing etching gas or the like. By controlling the etching conditions, the etching is stopped on the surface of the etching stopper film 117. The resist mask 121 is removed by ashing using oxygen plasma. Via holes reaching the etching stopper film 117 are therefore formed. At this time, via holes 12 for inspection for hole opening are also formed.

Figure 10D:
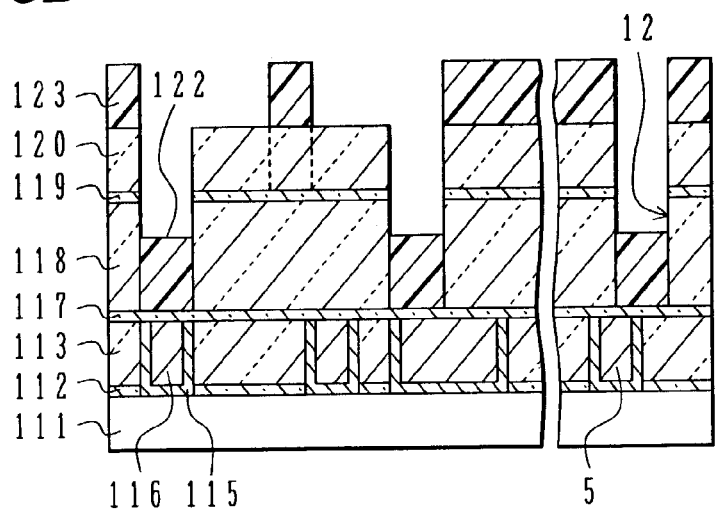

As shown in FIG. 10D, non-photosensitive resin is coated on the surface of the wiring layer insulating film 120, and the resin is melted from its surface to leave fillers 122 only in the via holes. Thereafter, a resist film 123 having openings corresponding to wiring lines is formed on the surface of the wiring layer insulating film 120.

By using the resist film 123 as an etching mask, the wiring layer insulating film 120 is etched by RIE using CF-containing gas. This etching stops on the surface of the etching stopper film 119. Wiring grooves are therefore formed through the wiring layer insulating film 120.

Figure 10E:
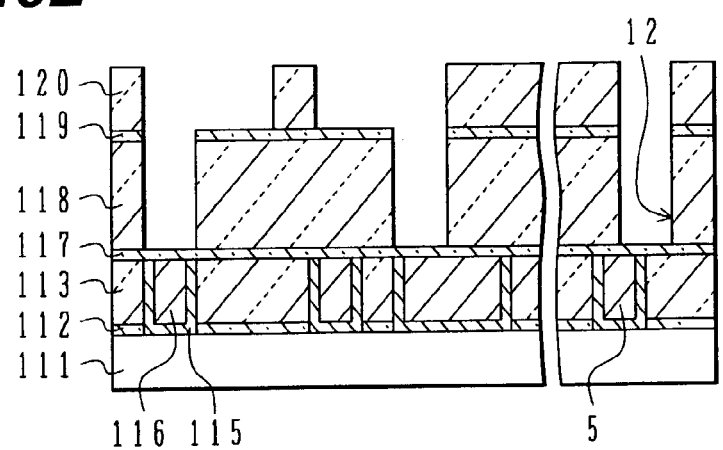

As shown in FIG. 10E, the resist film 122 is removed by ashing using oxygen plasma. At this time the fillers 122 of non-photosensitive resin are also removed. The etching stopper films 119 and 117 are exposed on the bottoms of the wiring grooves and via holes.

Figure 10F:
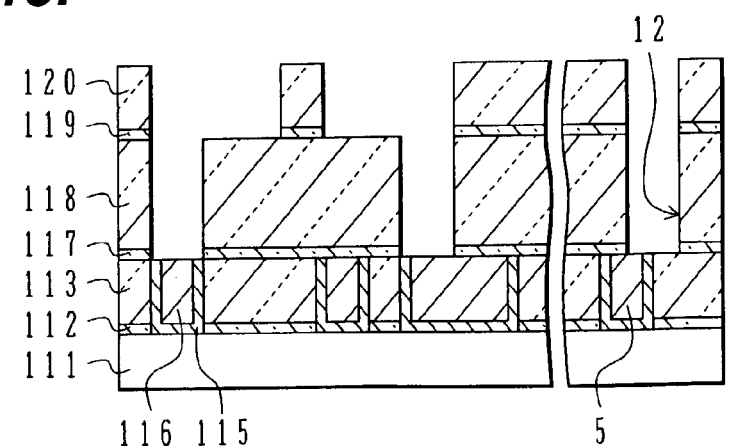

As shown in FIG. 10F, the exposed etching stopper films 119 and 117 are removed by RIE using CHF-containing etching gas. In this state, the bottom of the via hole 12 for inspection for hole opening is observed to perform inspection for hole opening.

Figure 10G:
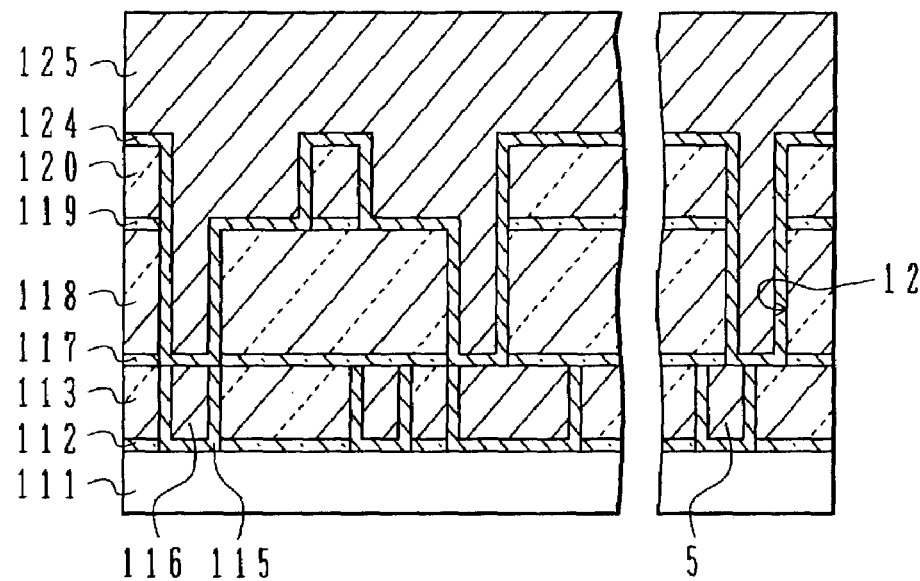

As shown in FIG. 10G, a barrier metal layer 124 is formed covering the upper surface of the wiring layer insulating film 120 and the inner surfaces of the wiring grooves and via holes, and a main wiring layer 125 is formed on the barrier metal layer 124. The barrier metal layer 124 and main wiring layer 125 are formed by the method similar to that of forming the lower barrier metal layer 115 and main wiring layer 116. The barrier metal layer 124 and main wiring layer 125 deposited above the upper surface of the wiring layer insulating film 120 are removed by CMP.

Figure 10H:
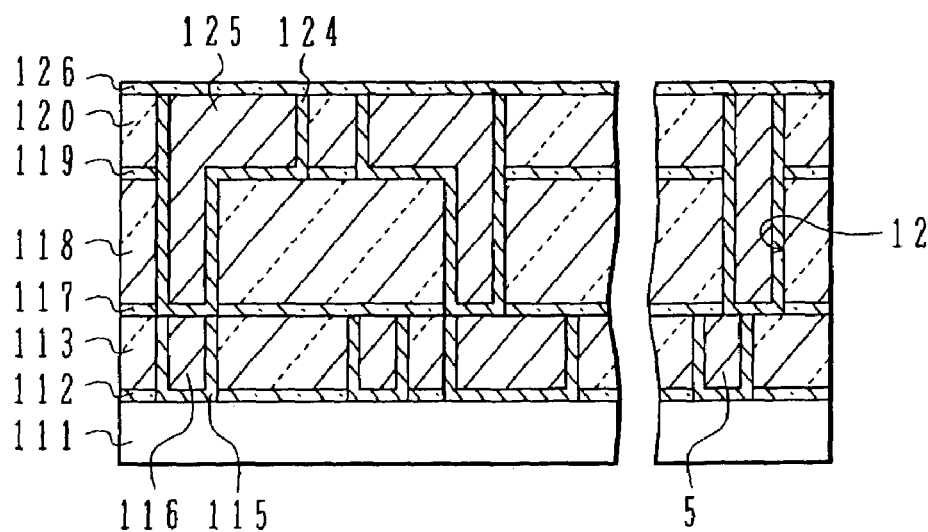

As shown in FIG. 10H, the surface planarized by CMP is covered with an etching stopper film 126 of the fourth layer. The wiring 125 of a dual damascene structure is therefore formed.

In the embodiment method shown in FIGS. 10A to 10H, the inspection pattern for hole opening of one of the embodiments is applied to the dual damascene structure. The inspection pattern for hole opening may be applied to a single damascene structure.

Figure 11:
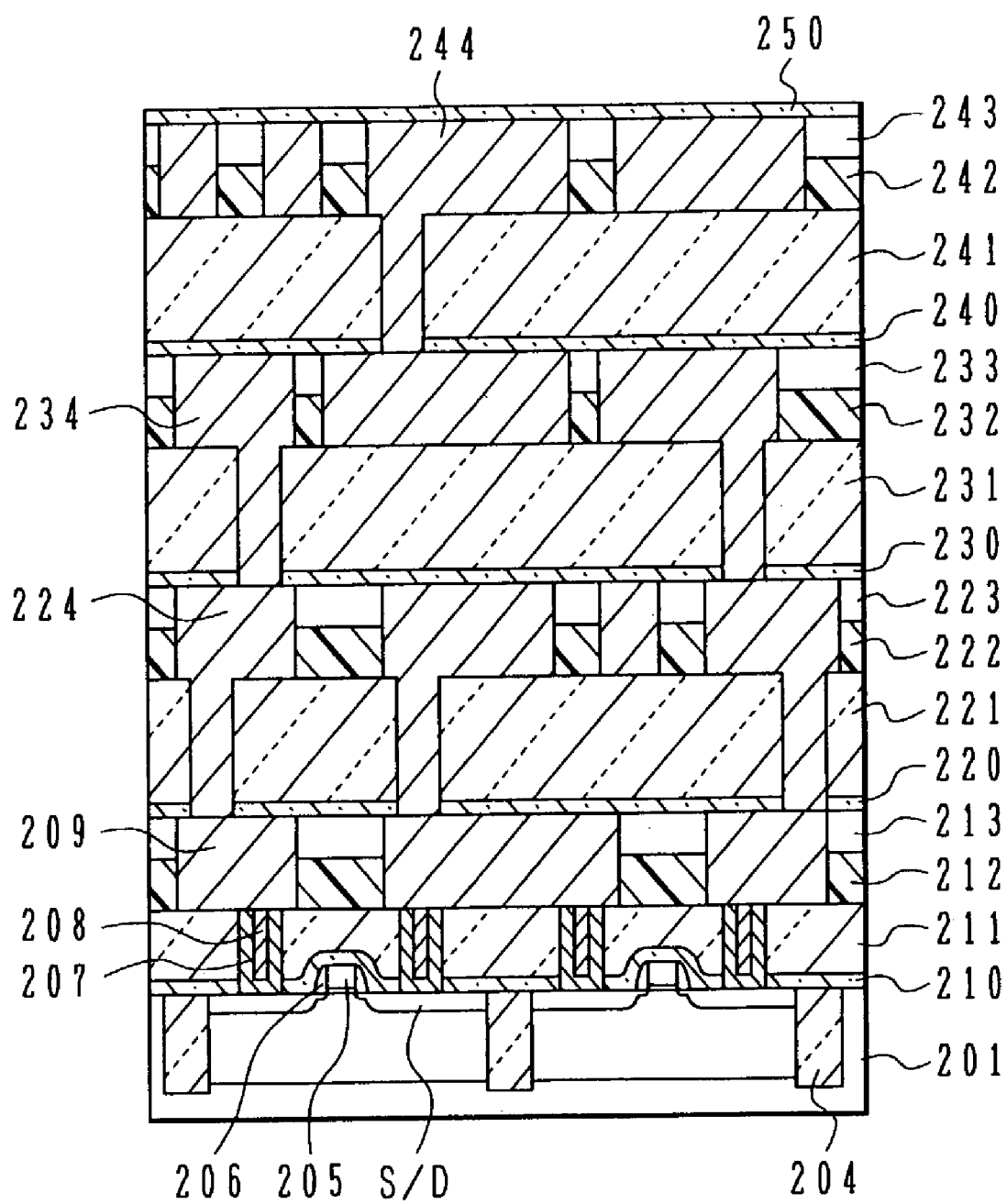
FIG. 11 is a cross sectional view of a semiconductor device capable of incorporating the inspection for hole opening used by the semiconductor device of the embodiments.
Figure 12A:
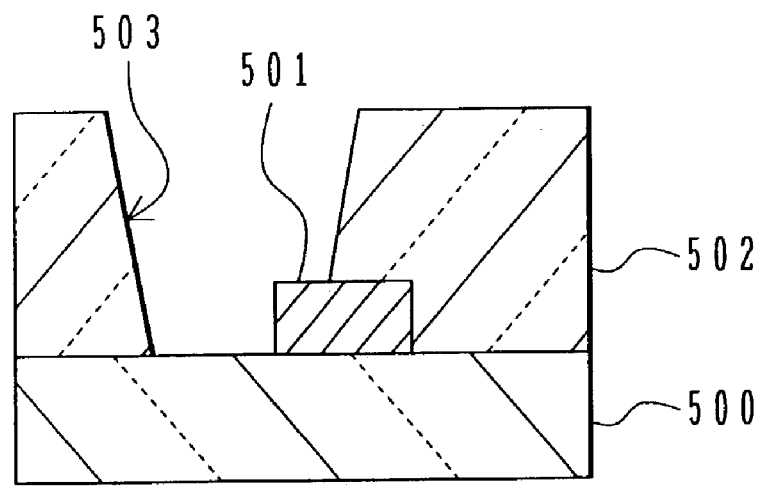
FIGS. 12A and 12B are cross sectional views showing via holes and wiring lines to be subjected to conventional inspection for hole opening and inspection for alignment shift.
Figure 12B:
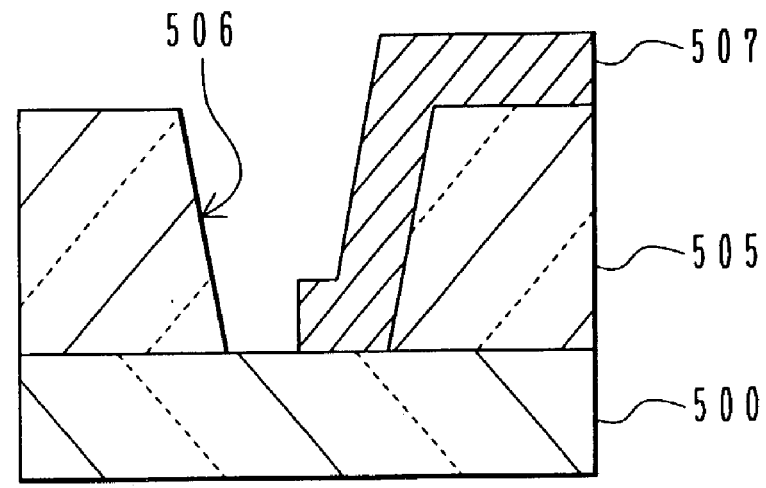
Figure 13A:
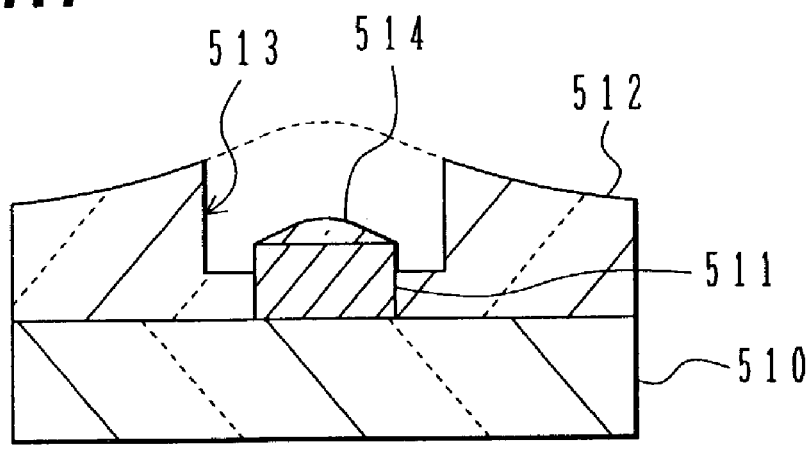
FIGS. 13A and 13B are cross sectional views showing via holes and wiring lines to be subjected to conventional inspection for hole opening.
Figure 13B:
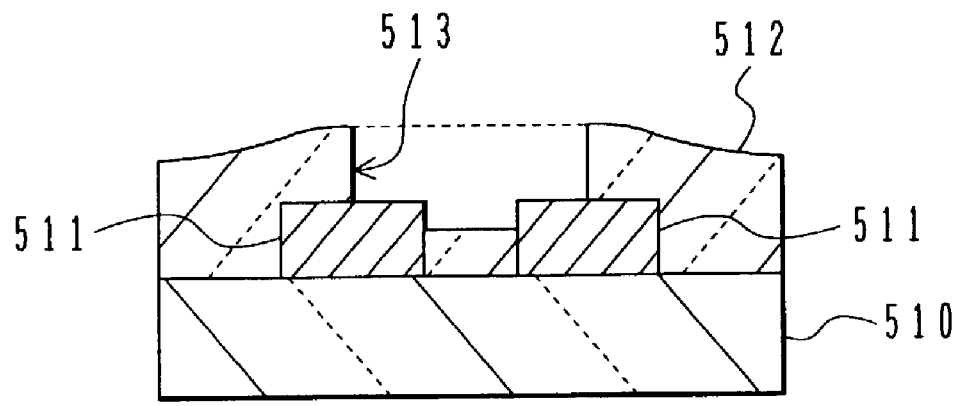
Figure 14:
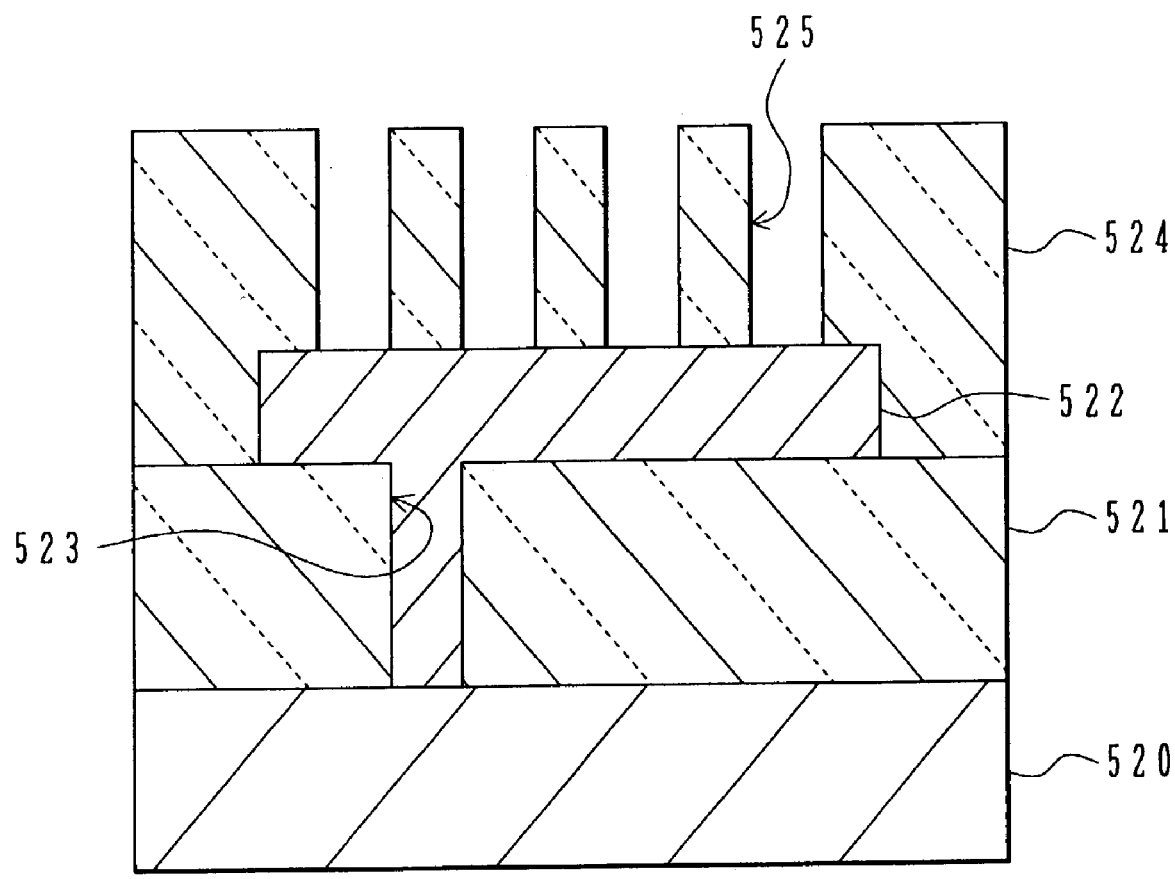
FIG. 14 is a cross sectional view showing via holes and a wiring line to be subjected to conventional inspection for hole opening.
Figure 15A:
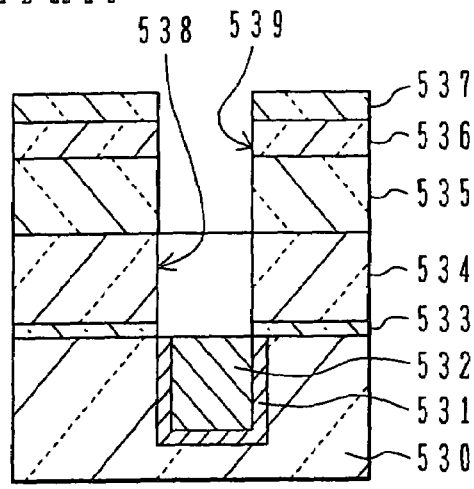
FIGS. 15A and 15C are cross sectional views of the peripheral areas of via holes wherein a conventional inspection method for hole opening is applied to wiring patterns of a damascene structure.
Figure 15B:
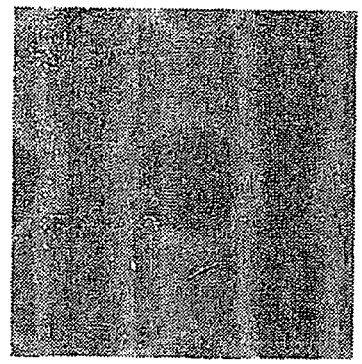
FIGS. 15B and 15D are SEM photographs of the devices shown in FIGS. 15A and 15C.
Figure 15C:
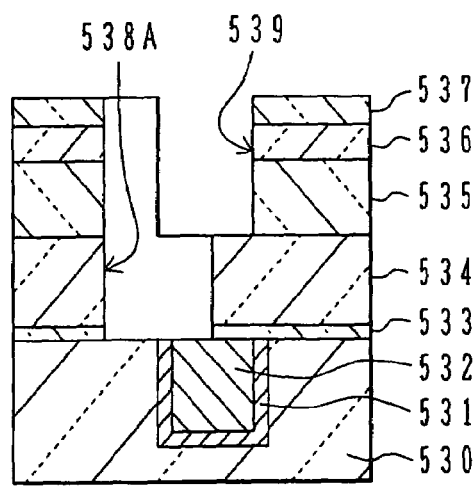
Figure 15D:
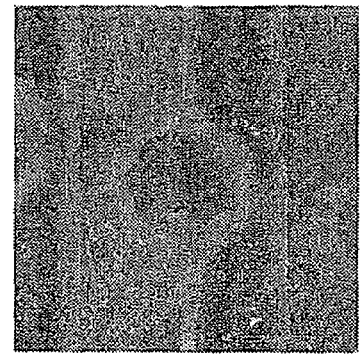

FIG. 11 is a cross sectional view showing an example of a semiconductor device having a damascene multi-layer wiring structure. An element separation trench is formed in a predetermined area of a semiconductor wafer 201 having wells, and insulating material such as silicon oxide is filled in the element separation trench to form an element separation insulating region 204 through shallow trench isolation (STI).

In the active region defined by the element separation insulating region 204, an insulated gate electrode 205 and side wall spacers 206 are formed. Source/drain regions S/D are formed on both sides of the insulated gate electrode 205 through ion implantation. A first etching stopper film 210 is formed covering the insulated gate electrode 205, and a first lower insulating film 211 is formed on the first etching stopper film. Conductive plugs made of a barrier metal layer 207 and wiring metal region 208 are formed through the first lower insulating film 211 and first etching stopper film 210.

An organic insulating film 212 and a first upper insulating film 213 are formed on the first lower insulating film 211. If the organic insulating film is a coating type, it has a planarization function so that a flat surface can be obtained without performing CMP. First wiring lines 209 are embedded in wiring grooves formed through the first upper insulating film 213 and organic insulating film 212.

A second etching stopper film 220 and a second lower insulating film 221 are formed on the surface of the first wiring lines 209, and CMP is performed for planarization. On the second lower insulating film 221, a second organic film 222 and a second upper insulating film 223 are formed to form a dual damascene wiring structure 224.

Similarly, a third etching stopper film 230 and a third lower insulating film 231 are formed on the surface of the second upper insulating film 223, and CMP is performed for planarization. On the third lower insulating film 231, a third organic film 232 and a third upper insulating film 233 are formed to form a second dual damascene wiring structure 234.

A fourth etching stopper film 240 and a fourth lower insulating film 241 are formed on the surface of the third upper insulating film 233, and CMP is performed for planarization. On the fourth lower insulating film 241, a fourth organic film 242 and a fourth upper insulating film 243 are formed to form a third dual damascene wiring structure 244. A surface protective film 250 is formed over the multi-layer wiring structure.

Inspection for hole opening of the embodiment is performed after the process of forming via holes through each layer of the multi-layer structure.

Although the multi-layer wiring structure of four layers has been described, the number of wring layers may be increased or decreased as desired. In place of the lamination of an organic insulating film and an upper insulating film, a lamination of an etching stopper film and an insulating film may also be used. A lamination structure having a low dielectric constant insulating film such as a silicon oxide film containing fluorine or carbon and a porous silicon oxide film may be used.

The present invention has been described in connection with the preferred embodiments. The invention is not limited only to the above embodiments. It is apparent that various modifications, improvements, combinations, and the like can be made by those skilled in the art.

I claim:

1. A semiconductor device manufacturing method comprising steps of:
    (a) forming a first film of insulating material on a first surface defined on a substrate, the substrate having a surface layer portion made of insulating material and formed with a wiring groove filled with a wiring line of conductive material, an upper surface of the wiring line being exposed on the first surface, the wiring line being electrically connected to a conductive member, and the conductive member occupying an area larger than an area of the wiring line as viewed along a line parallel to a normal to the first surface;
    (b) forming a via hole through the first film, the via hole being formed so that a boundary between the wiring line and the surface layer portion of insulating material passes through the inside of the via hole as viewed along a line parallel to the normal to the first surface; and
    (c) observing a bottom of the via hole with an apparatus for obtaining image information by utilizing secondary electrons and reflection electrons from a specimen, to judge whether a state of the bottom of the via hole is accepted or rejected.

2. A semiconductor device manufacturing method according to claim 1, wherein the conductive member is a pad or an antimoisture ring disposed in the same wiring layer as the wiring line or in a wiring layer lower than the wiring line.

3. A semiconductor device manufacturing method according to claim 1, wherein the substrate includes a semiconductor substrate and a multi-layer wiring structure formed on a surface of the semiconductor substrate, and the conductive member is the semiconductor substrate.

4. A semiconductor device manufacturing method according to claim 1, wherein:
    the substrate includes a semiconductor substrate, a MOS transistor formed on a surface of the semiconductor substrate and having a source region, a drain region, a gate insulating film and a gate electrode, and a capacitor dielectric film formed on the surface of the semiconductor substrate and made of the same material as the gate insulating film; and
    the conductive member is formed on the capacitor dielectric film and constitutes a capacitor together with the semiconductor substrate that serves as one electrode of the capacitor.

5. A semiconductor device manufacturing method according to claim 4, wherein the capacitor dielectric film has a thickness equal to a thickness of the gate insulating film.

6. A semiconductor device manufacturing method according to claim 4, wherein the capacitor dielectric film is formed at a same time as when the gate insulating film is formed.

7. A semiconductor device manufacturing method according to claim 1, wherein said step (a) comprises the steps of:
    forming a second film of insulating material disposed on a second surface located intermediate the substrate and the first surface, an upper surface of the second film defining the first surface;
    forming a wiring groove in the second film;
    depositing a conductive film on the second film, the conductive film burying the inside of the wiring groove; and
    removing the conductive film deposited upper than the first surface to leave the wiring line in the wiring groove.

8. A semiconductor device manufacturing method according to claim 1, wherein the first film comprises:
    an etching stopper film directly disposed on the first surface and made of material different from the surface layer portion defining the first surface; and
    an interlayer insulating film disposed on the etching stopper film and made of material different from the etching stopper film,
    and said step (b) comprises the steps of:
    forming the via hole in the interlayer insulating film under a condition that an etching rate of the etching stopper film is slower than an etching rate of the interlayer insulating film; and
    removing the etching stopper film exposed on the bottom of the via hole under a condition that an etching rate of the surface layer portion defining the first surface is slower than an etching rate of the etching stopper film.

9. A semiconductor device manufacturing method according to claim 1, wherein a plurality of other wiring lines are disposed on both sides of and in parallel to the wiring line.

10. A semiconductor device manufacturing method according to claim 9, wherein the other wiring lines are disposed uniformly in a first region of the first surface, and an area of wiring lines in the first area is 25% or larger of an area of the first region.

11. A semiconductor device manufacturing method according to claim 10, wherein the first region on the first surface is depressed more than a peripheral region of the first region.

12. A semiconductor device manufacturing method according to claim 1, wherein the wiring line surrounds an insulating region on the first surface, and the via hole is disposed so that a boundary line between the wiring line and insulating region passes through an inside of the via hole as viewed along a line in parallel to the normal to the first surface.

13. A semiconductor device manufacturing method according to claim 12, wherein an upper surface of the wiring line is depressed in the first surface, and an upper surface of the insulating region is lower than a peripheral upper surface of the wiring line.

14. A semiconductor device manufacturing method according to claim 1, wherein in the step of forming the via hole, a second via hole is formed in the first film, the second via hole being disposed inside of the wiring line as viewed along a line parallel to the normal of the first surface.

15. A semiconductor device manufacturing method according to claim 1, wherein the wiring line and the conductive member are disposed in a same level.

* * * * *